United States Patent [19]

Papageorge et al.

[11] Patent Number: 5,288,769
[45] Date of Patent: Feb. 22, 1994

[54] THERMALLY CONDUCTING ADHESIVE CONTAINING ALUMINUM NITRIDE

[75] Inventors: Marc V. Papageorge; Robert W. Pennisi, both of Boca Raton; James L. Davis, Coral Springs, all of Fla.

[73] Assignee: Motorola, Inc., Schaumburg, Ill.

[21] Appl. No.: 935,360

[22] Filed: Aug. 28, 1992

Related U.S. Application Data

[63] Continuation of Ser. No. 676,022, Mar. 27, 1991, abandoned.

[51] Int. Cl.⁵ .................. B32B 5/16; B32B 15/02
[52] U.S. Cl. .................. 523/200; 428/403; 428/404; 428/901; 524/428; 252/510; 252/511; 252/518
[58] Field of Search .................. 524/428; 523/200; 428/403, 404, 901; 252/518, 511, 510

[56] References Cited

U.S. PATENT DOCUMENTS

| | | | |
|---|---|---|---|
| 4,440,878 | 4/1984 | Kawahara et al. | 524/413 X |
| 4,769,270 | 9/1988 | Nagamatsu et al. | 428/209 X |
| 4,770,953 | 9/1988 | Horiguchi et al. | 428/209 X |
| 4,859,364 | 8/1989 | Yamamoto et al. | 252/518 X |
| 4,888,135 | 12/1989 | Tsunaga et al. | 252/518 X |
| 4,906,596 | 3/1990 | Joslin et al. | 501/17 |
| 4,917,958 | 4/1990 | Akai et al. | 428/457 |
| 4,942,190 | 7/1990 | Murayama et al. | 523/442 X |
| 5,011,870 | 4/1991 | Peterson | 524/428 X |
| 5,011,872 | 4/1991 | Latham et al. | 524/428 X |
| 5,021,494 | 6/1991 | Toya | 524/424 X |
| 5,045,400 | 9/1991 | Esashi | 428/433 X |
| 5,057,903 | 10/1991 | Olla | 357/72 |
| 5,061,549 | 10/1991 | Shores | 428/908 X |
| 5,089,172 | 2/1992 | Allison et al. | 252/518 X |
| 5,165,983 | 11/1992 | Sugiura et al. | 428/688 X |

OTHER PUBLICATIONS

"Interfacial Reactions in Ceramic-Metal Systems" Ronald E. Loehman, Ceramic Bulletin, vol. 68, No. 4, 1989, pp. 891–896.

"Arm Study of Thin and Thick Film Metallization of AIN Substrates", A. D. Westwood & M. R. Notis, Mat. Res. Soc. Symp. Proc., vol. 108, 1988 Materials Research Society, pp. 331–335.

*Primary Examiner*—Daniel Zirker
*Attorney, Agent, or Firm*—Dale W. Dorinski

[57] ABSTRACT

Thermally conductive particles (14) for use in a polymeric resin are provided. The particles (10) are aluminum nitride coated with copper (12). The thermally conductive particles (14) are incorporated into a polymer (38) in order to provide, for example, a thermally conductive adhesive (36). The thermally conductive adhesive is used to bond an electronic component (32) to a circuit carrying substrate (34) in order to dissipate heat from the electronic component.

4 Claims, 3 Drawing Sheets

THERMALLY CONDUCTING ADHESIVE CONTAINING ALUMINUM NITRIDE

This is a continuation of application Ser. No. 07/676,022, filed Mar. 27, 1991 and now abandoned.

TECHNICAL FIELD

This invention relates generally to thermally conductive materials, and more specifically to thermally conductive particles and their incorporation in an adhesive.

BACKGROUND

Semiconductor device or chip bonding involves attaching the chip to a substrate with a layer of adhesive. The substrates may be as diverse as ceramic chip carders, organic printed wiring boards, copper heat sinks or Kovar lead frames. Typically, the adhesive does not serve an electrical function, or is at most a grounding contact. The functionality of the adhesive is therefore primarily defined by thermal and mechanical rather than electrical requirements. In order to provide for a highly reliable attachment of the semiconductor device to the substrate, the adhesive must be an excellent thermal conductor and also must approximate the thermal expansion coefficient of the chip. The thermal expansion mismatch between the chip and the substrate is absorbed primarily by the adhesive, making it susceptible to fatigue fracture or disbonding, sometimes transmitting stresses to the die. It would be highly desirable to formulate a die attach adhesive that has excellent thermal conductivity and a low thermal expansion coefficient.

In order to improve thermal conductivity and reduce the expansion coefficient, particulate fillers are added to the adhesives. Greater increases may be obtained by the incorporation of metallic fibers or other materials with improved thermal conductivity. Increasing the volume loading of fillers also results in a proportional increase in the thermal conductivity. If metallic powders or fibers are undesirable from an electrical standpoint, it has been shown that significant increases in thermal conductivity may be obtained using non-conductive materials such as silicon carbide or beryllium oxide. Because of their cost and toxicity considerations, these materials are seldom used. Inert silica materials are commonly used in electronic packaging adhesives. For other applications, you find calcium carbonates, calcium silicates, talcs, micas and even clay incorporated into the resin. Silica or silver particles are currently the primary fillers used in die attach adhesives. Although it provides excellent thermal conductivity, silver does not achieve the desired low thermal expansion coefficient. Silica, on the other hand, is used in adhesives in order to create a low thermal expansion coefficient material, but does not achieve the thermal conductivity that may be obtained through the use of silver.

As a result, a need exists for a lower cost filler material that can be used to formulate adhesives with improved thermal conductivity and lower thermal expansion coefficients.

SUMMARY OF THE INVENTION

Briefly, according to the invention, improved thermally conductive particles for use in a polymeric resin are provided. The particles are aluminum nitride coated with copper.

In another aspect of the invention, the thermally conductive particles are incorporated into a polymeric adhesive to provide a thermally conductive adhesive.

DETAILED DESCRIPTION OF THE PREFERRED EMBODIMENT

Figure 1:
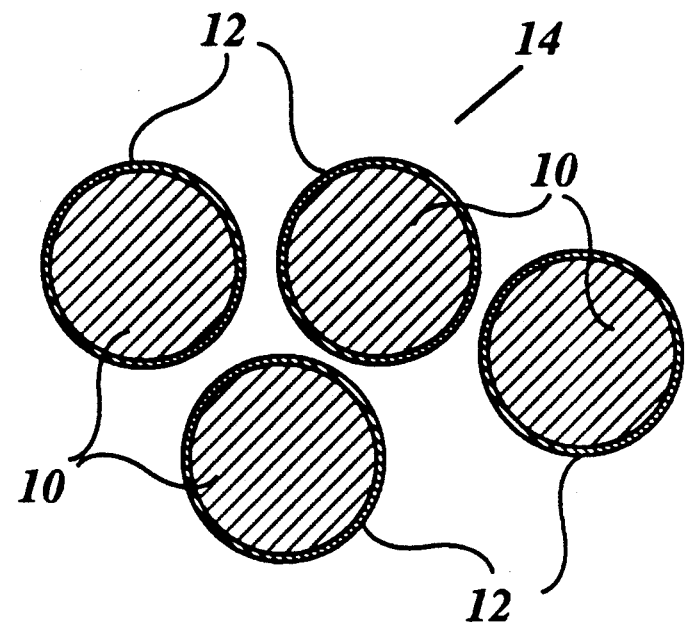
FIG. 1 is a cross-sectional view of an aluminum nitride particle coated with a thermally conductive material.
Figure 1:
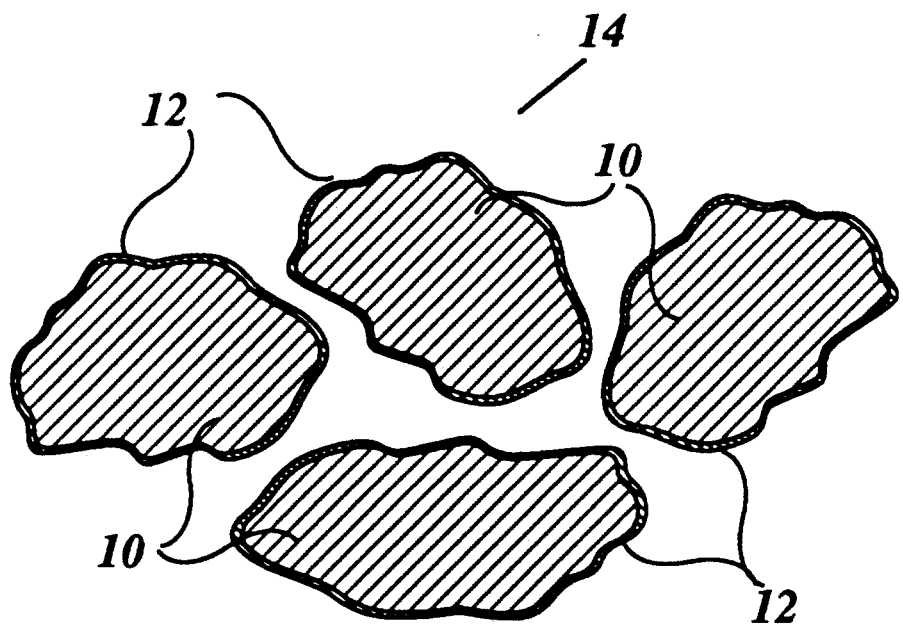

Aluminum nitride is a very good conductor of heat, and has been cast into complex forms and used as a heat sink. Referring now to FIG. 1, the present invention utilizes aluminum nitride converted into particles 10 and coated with a metal 12 to further enhance the thermal conductivity of the aluminum nitride 10. The particles are preferably spherically shaped, but may be other shapes in order to accomplish the desired result. The function of the metallized spheres 14 is to act a coupling agent and increase the thermal conductivity of substances such as adhesives that are poor conductors of heat. Aluminum nitride has a high thermal conductivity of 1.5 watt/cm°C. Coating the aluminum nitride particles with selected metals increases the rate of heat transfer into the particle. For example, the thermal conductivity of silver (4.5 watt/cm°C.) is greater than that of aluminum nitride, consequently silver transfers heat faster than aluminum nitride. Coating the aluminum nitride particles with a material such as silver increases the bulk thermal conductivity of the particles and results in a material with better heat transfer capability. Other materials may also be coated on the particles, such as beryllium, magnesium, tungsten, rhodium iridium, copper, gold, aluminum and their alloys. Each of these materials has a thermal conductivity greater than that of aluminum nitride.

The particles may be coated by plating in electroless metal plating baths or by vacuum deposition of the metal coating by techniques such as sputtering, evaporation, or chemical vapor deposition. The equipment and techniques used to coat the particles are common to the electronics and plating industries, and well known to those skilled in the art. The precise coating process steps for aluminum nitride are similar to those employed in coating any other powdered media.

When the coated particles are mixed in adhesives such as epoxy, acrylic, silicone or polyimide, the thermal conductivity of the resulting adhesive is increased significantly. An example depicting the increased thermal conductivity obtained with aluminum nitride spheres coated with copper metal and dispersed into a matrix of epoxy resin is now shown.

EXAMPLE 1

A bisphenol A/epichlorohydrin-type epoxy resin and accelerator were mixed together along with uncoated aluminum nitride spheres mixture was coated onto an aluminum substrate to form a coating thickness of approximately 0.061 inches and cured. After curing, a thermocouple was attached to the epoxy resin surface and the assembly was placed on a hot plate maintained at 180° C. The temperature of the thermocouple was monitored and readings were periodically taken.

EXAMPLE 2

Aluminum nitride spheres ranging in size from fifty to one hundred microns were coated with electroless copper. A bisphenol A/epichlorohydrin-type epoxy resin and accelerator were mixed together. Equal parts of the epoxy resin and coated spheres were mixed together to form a dispersion of the aluminum nitride spheres in the resin. The mixture was then coated onto an aluminum substrate to a coating thickness of approximately 0.061 inches. After curing, the epoxy mixture formed a smooth, hard film. A thermocouple was placed on the surface of the epoxy resin and the assembly was placed on a hot plate maintained at 180° C. The temperature of a thermocouple was monitored and recordings of the thermocouple readings were made at selected intervals.

Figure 2:
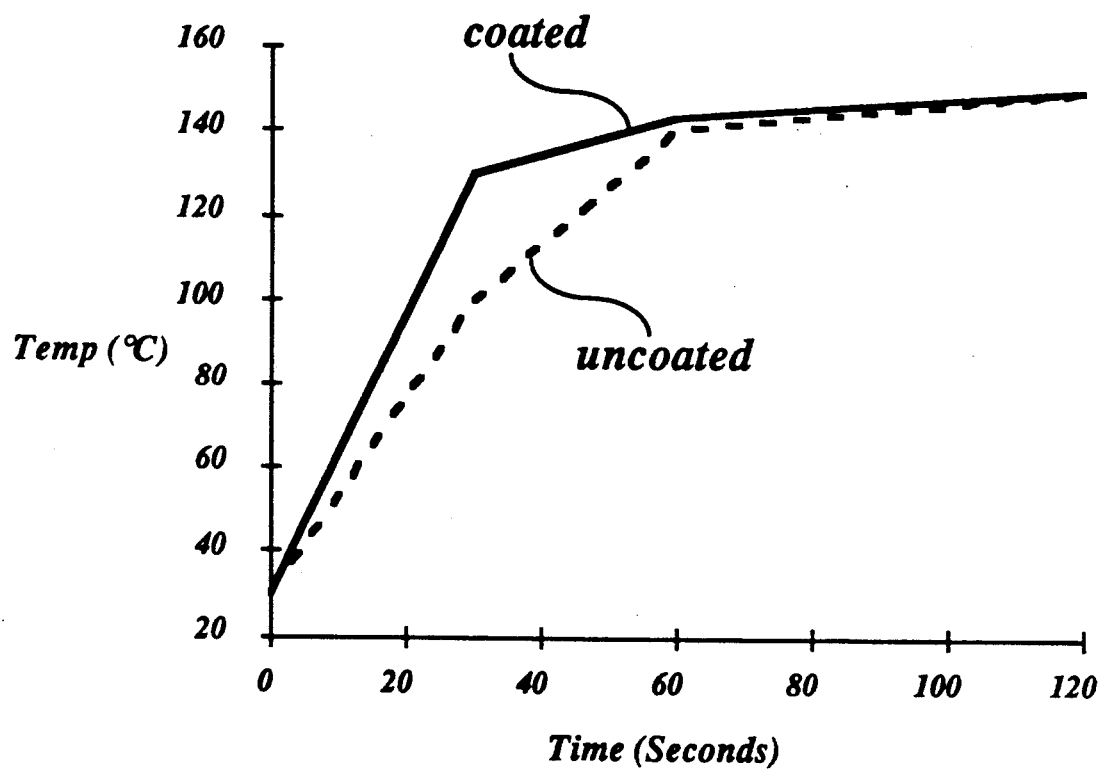
FIG. 2 is a comparative graph of the temperature change of two epoxy adhesives in accordance with the present invention.

Referring now to FIG. 2, it can be seen that the aluminum nitride spheres coated with copper conducted heat through the epoxy resin more readily than he uncoated aluminum nitride spheres as shown by the lower line in the graph. The two lines converge as a steady state condition is reached.

Another type of thermally conductive particle may be fabricated by coating the aluminum nitride particles with a reactive material such as titanium. Depositing a coating of titanium on aluminum nitride while under at least a partial vacuum by chemical vapor deposition, evaporation or sputtering results in a chemical interaction between the titanium and the aluminum nitride to form titanium nitride. The reaction of titanium with aluminum nitride to form titanium nitride according to

$$Ti + AlN \rightarrow TiN + Al$$

is thermodynamically favored, as shown by the Gibbs free energy calculations for titanium nitride ($-73.6$ kcal) and aluminum nitride ($-70.3$ kcal). (Compounds with a lower Gibbs free energy are more stable and therefore are the preferred reaction products). Oxides or glassy phases at the aluminum nitride surface cause a decrease in heat dissipation and adhesion. The reaction between titanium and aluminum nitride results in a material with greater thermal conductivity than obtained with oxides, glassy phases or aluminum nitride coated with other non-reactive materials. Other reactive metals such as chrome and tantalum may be considered to have similar reaction products.

The modified adhesive made with the metal coated particles may be used as a die attach adhesive for semiconductor devices to increase the heat flow between the semiconductor device and the substrate. Silver coated aluminum nitride particles quickly transfer heat uniformly throughout the substrate resulting in a significant reduction of the heat load that would otherwise be concentrated under the device. Coating a non-conductor such as aluminum nitride with a metal allows the filled adhesive to become an electrical conductor, allowing the die to be grounded to the substrate. The use of aluminum nitride as a filler also results in an adhesive with a lower coefficient of thermal expansion (CTE) compared to using a pure metal filler. For example, silver has an expansion coefficient of $19 \times 10 - 6$ in/in/°C. compared to $2.7 \times 10 - 6$ in/in/°C. for aluminum nitride. This type of filled adhesive reduces the interfacial stress between the semiconductor device and the substrate, thus improving the life of the semiconductor device.

Figure 3:
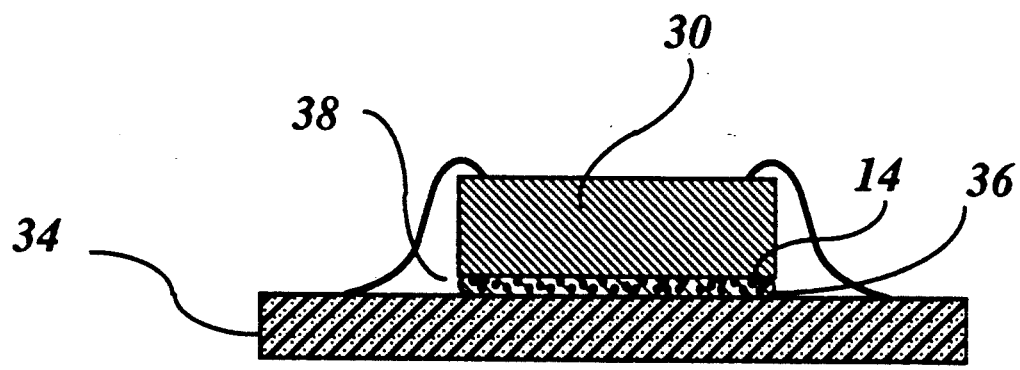
FIG. 3 is a cross-sectional view of a semiconductor device bonded to a substrate with the thermally conductive adhesive in accordance with the invention.

Referring now to FIG. 3, the adhesive obtained by mixing the metallized aluminum nitride particles 14 with an epoxy resin 38, for instance, may be used to manufacture an electronic assembly consisting of a semiconductor device 32 bonded to a substrate 34 which is typically used in a communications device such as portable radio. By increasing the thermal conductivity of the adhesive 36 and decreasing the expansion coefficient, high power devices that generate a great deal of heat like power amplifiers in portable radios, may now be reliably attached to substrates. The low CTE achieved by the disclosed material also allows the use of much larger die than was previously attainable. Large die, such as microprocessors, are often used in portable radio transmitting devices.

The coated aluminum nitride particles 14 may also be mixed in other polymers to create highly thermally conductive adhesives for other structural applications. Coated aluminum nitride particles 14 may be employed as fillers in other polymers such as molding compounds used to transfer mold semiconductor packages such as dual in line packages, transistors, chip carders and other discrete devices. These types of coated aluminum nitride particles may also be employed as fillers in thermoplastic polymers used in molding housings for communication devices and computers, to provide a housing with heat sinking ability. By judicious selection of the coating material on the aluminum nitride and control of the quantity of aluminum nitride particles used in the adhesive matrix, the thermal conductivity and expansion coefficients of the finished product may be tailored to the desired end use.

As a result, coating aluminum nitride particles with selected metals results in particles that have higher thermal conductivity than previously obtained. By mixing these particles in an adhesive matrix, an adhesive with custom tailored thermal expansion and thermal conductivity properties can be obtained that may be used to achieve high reliability heat sinking for large die and those that generate heat. In addition, the improved thermal conductivity reduces the hot spots normally generated in an operating semiconductor device, and lowers the stress imparted to the die by lowering the CTE of the adhesive. The examples outlined, while illustrative, are not meant to be considered limiting, and additional adhesive formulations may be resorted to without departing from the spirit of the invention.

What is claimed is:

1. A thermally conducting adhesive, comprising:
   an adhesive material having aluminum nitride particles dispersed within the adhesive material, the aluminum nitride particles having a copper coating, whereby the coated aluminum nitride particles impart higher thermal conductivity to the adhesive material than uncoated aluminum nitride particles.

2. A thermally conducting adhesive, comprising a mixture of:
   an adhesive material selected from the group consisting of epoxy, acrylic, phenolic and silicone adhesives; and
   copper coated aluminum nitride particles dispersed throughout the adhesive material, such that the thermally conducting adhesive conducts heat more rapidly than a mixture having uncoated aluminum nitride particles dispersed throughout the adhesive.

3. The thermally conductive adhesive as described in claim 1, wherein the aluminum nitride particles are substantially spherical.

4. A thermally conductive die attach adhesive for use in coupling a semiconductor device to a substrate, comprising copper coated aluminum nitride spheres dispersed throughout an epoxy adhesive material, whereby the copper coated aluminum nitride spheres impart higher thermal conductivity to the epoxy adhesives material than an attainable through the utilization of uncoated aluminum nitride spheres.

* * * * *

UNITED STATES PATENT AND TRADEMARK OFFICE
CERTIFICATE OF CORRECTION

PATENT NO. : 5,288,769
DATED : February 22, 1994
INVENTOR(S) : Papageorge et al.

It is certified that error appears in the above-indentified patent and that said Letters Patent is hereby corrected as shown below:

Column 6, line 4, delete "an" and insert therefor -- are --.

Signed and Sealed this

Thirteenth Day of September, 1994

Attest:

BRUCE LEHMAN

*Attesting Officer*     *Commissioner of Patents and Trademarks*